(12) United States Patent
Song et al.

(10) Patent No.: US 7,707,716 B2
(45) Date of Patent: May 4, 2010

(54) METHOD OF MANUFACTURING BUILD-UP PRINTED CIRCUIT BOARD

(75) Inventors: Jong Seok Song, Seoul (KR); Taehoon Kim, Gyunggi-do (KR); Dong Sun Kim, Gyunggi-do (KR); Hye Yeon Cha, Gyunggi-do (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 246 days.

(21) Appl. No.: 11/709,215

(22) Filed: Feb. 22, 2007

(65) Prior Publication Data

US 2007/0261234 A1    Nov. 15, 2007

(30) Foreign Application Priority Data

May 10, 2006    (KR) .................. 10-2006-0042015

(51) Int. Cl.
*H01K 3/10*    (2006.01)
(52) U.S. Cl. ........................... 29/852; 29/846; 29/831
(58) Field of Classification Search ................ 29/846, 29/847, 852, 831, 830
See application file for complete search history.

(56) References Cited

U.S. PATENT DOCUMENTS

| | | | | |
|---|---|---|---|---|
| 3,673,680 | A * | 7/1972 | Tanaka et al. ................. | 29/837 |
| 4,383,363 | A * | 5/1983 | Hayakawa et al. ............ | 29/847 |
| 5,263,243 | A * | 11/1993 | Taneda et al. ................. | 29/830 |
| 6,309,912 | B1 * | 10/2001 | Chiou et al. .................. | 438/118 |
| 6,711,812 | B1 * | 3/2004 | Lu et al. ........................ | 29/852 |
| 6,810,583 | B2 * | 11/2004 | Carpenter et al. ............. | 29/852 |
| 7,037,586 | B2 * | 5/2006 | Yokota et al. ................. | 428/416 |
| 2004/0048050 | A1 * | 3/2004 | Cassat et al. .................. | 428/209 |
| 2004/0107569 | A1 * | 6/2004 | Guzek et al. .................. | 29/846 |
| 2004/0121134 | A1 * | 6/2004 | Bijkerk et al. ................. | 428/212 |
| 2005/0102830 | A1 * | 5/2005 | Saiki et al. .................... | 29/847 |

FOREIGN PATENT DOCUMENTS

| | | |
|---|---|---|
| JP | 62-171187 | 7/1987 |
| JP | 1-215034 | 8/1989 |
| JP | 10-135272 | 5/1998 |
| JP | 11-298120 | 10/1999 |
| JP | 2001-85471 | 3/2001 |

(Continued)

OTHER PUBLICATIONS

Japanese Office Action issued on Apr. 14, 2009 in corresponding Japanese Patent Application 2007-047671.

(Continued)

*Primary Examiner*—Essama Omgba

(57) ABSTRACT

A method of manufacturing a build-up printed circuit board, in which the circuit of a build-up printed circuit board including a core layer and an outer layer is realized by forming the metal seed layer of the core layer using a dry process, consisting of ion beam surface treatment and vacuum deposition, instead of a conventional wet process, including a wet surface roughening process and electroless plating. When the wet process is replaced with the dry process in the method of the invention, the circuit layer can be formed in an environmentally friendly manner, and as well, all circuit layers of the substrate including the core layer and the outer layer can be manufactured through a semi-additive process. Further, the peel strength between the resin substrate and the metal layer can be increased, thus realizing a highly reliable fine circuit.

9 Claims, 16 Drawing Sheets

FOREIGN PATENT DOCUMENTS

| | | |
|---|---|---|
| JP | 2001-127198 | 5/2001 |
| JP | 2002-050873 | 2/2002 |
| JP | 2003-309356 | 10/2003 |
| JP | 2004-134679 | 4/2004 |
| JP | 2005-191112 | 7/2005 |
| KR | 10-2002-0028597 | 4/2002 |

OTHER PUBLICATIONS

Japanese Office Action dated Jun. 5, 2009 issued in corresponding Japanese Patent Application 2006-329093.

English Translation of the Chinese Office Action issued on Mar. 6, 2009 in corresponding Chinese Patent Application 200710087205.8.

* cited by examiner

FIG.1A – Prior Art   FIG.1B – Prior Art
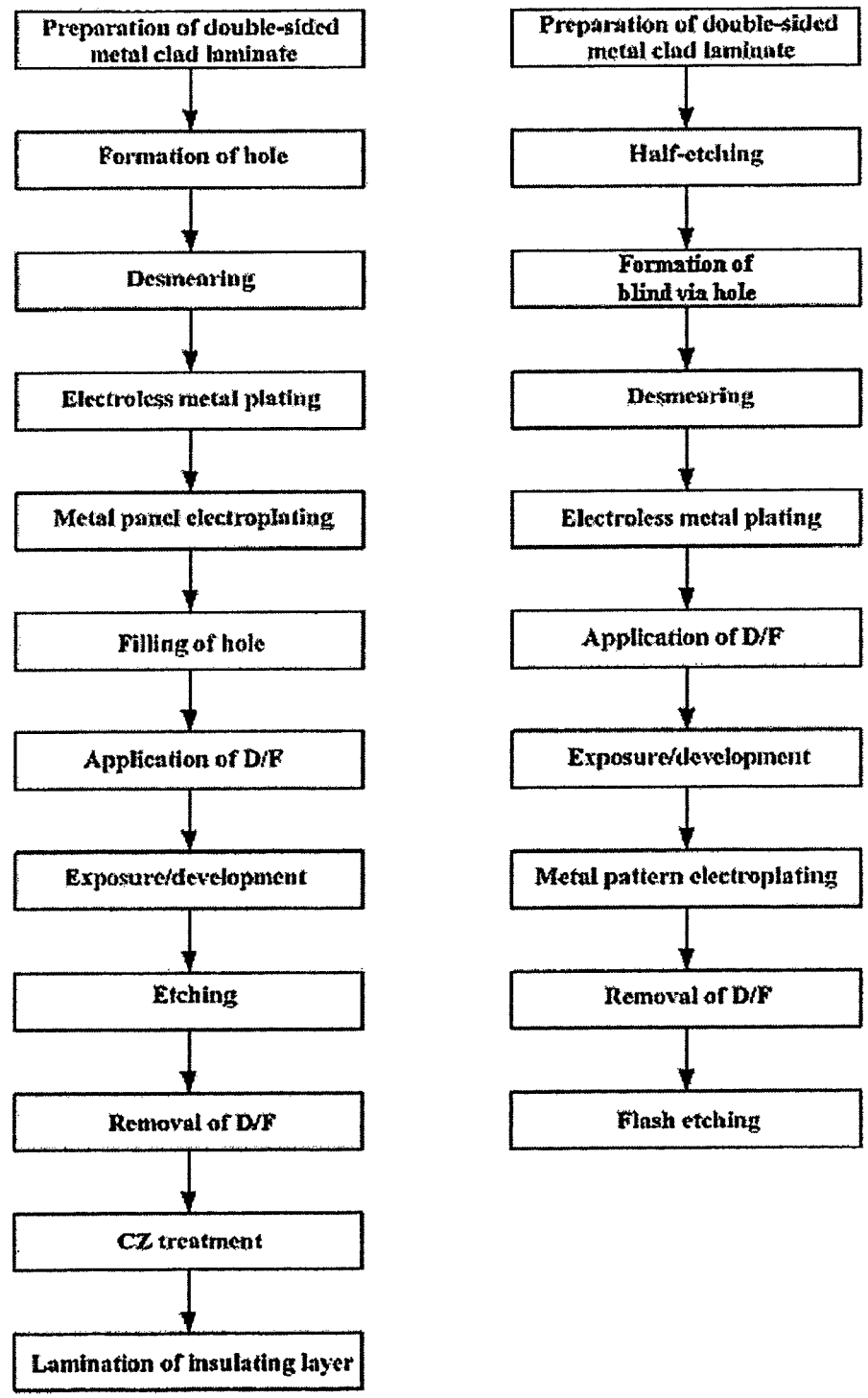

FIG.2A – Prior Art
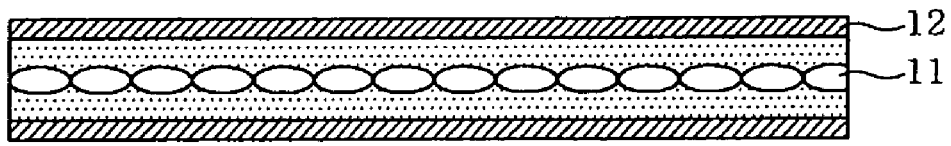
FIG.2B – Prior Art
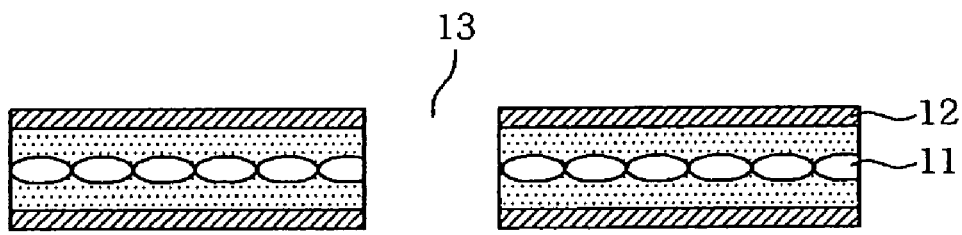
FIG.2C – Prior Art
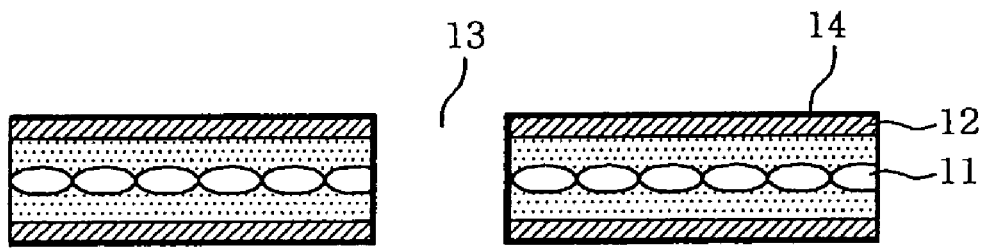
FIG.2D – Prior Art
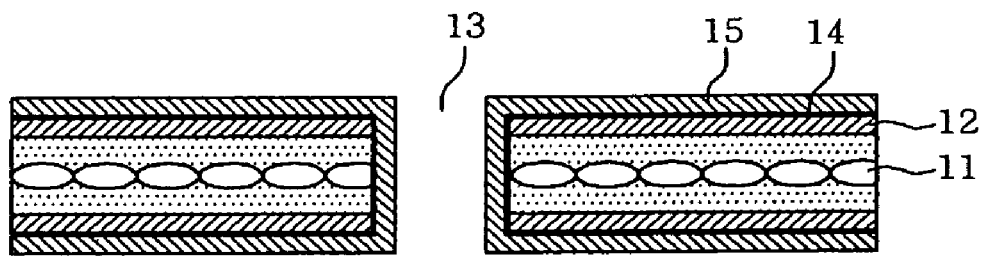

FIG. 2E – Prior Art
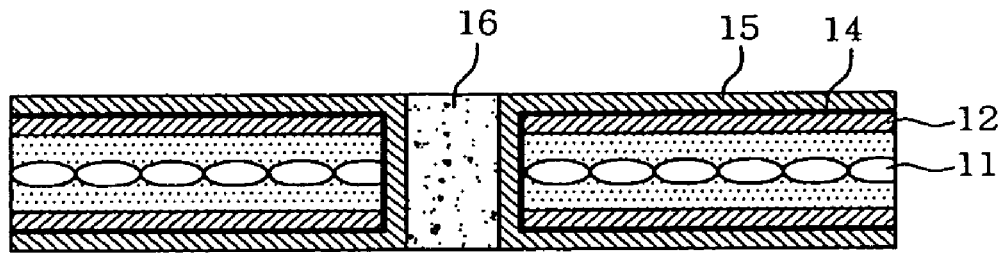
FIG. 2F – Prior Art
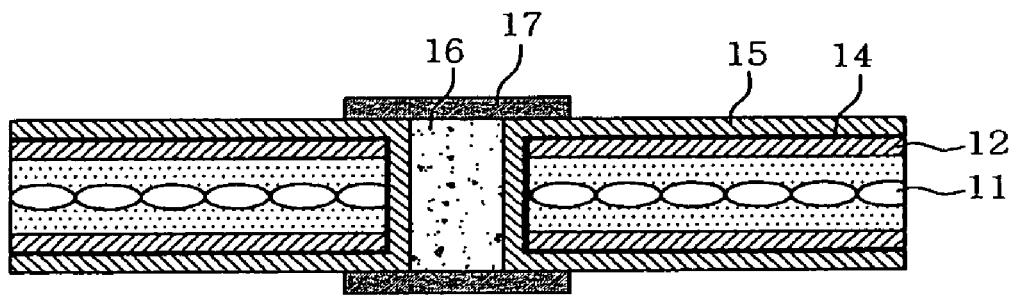
FIG. 2G – Prior Art
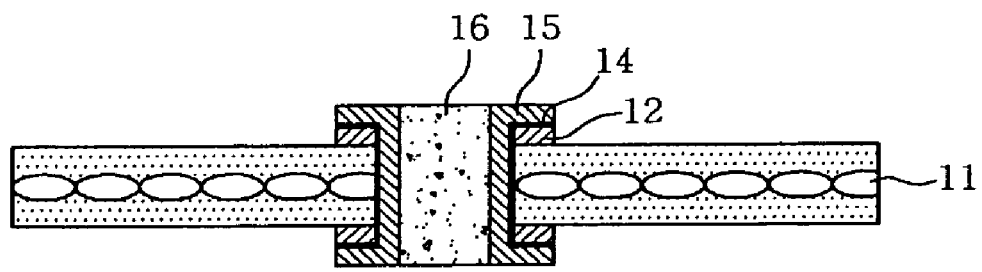
FIG. 3A – Prior Art
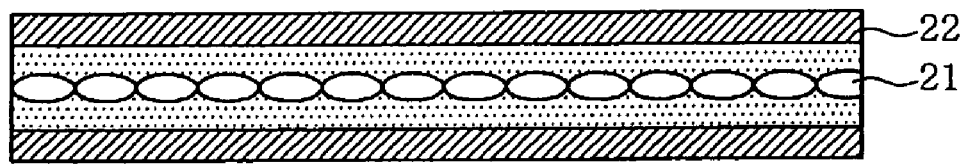

FIG.3B - Prior Art
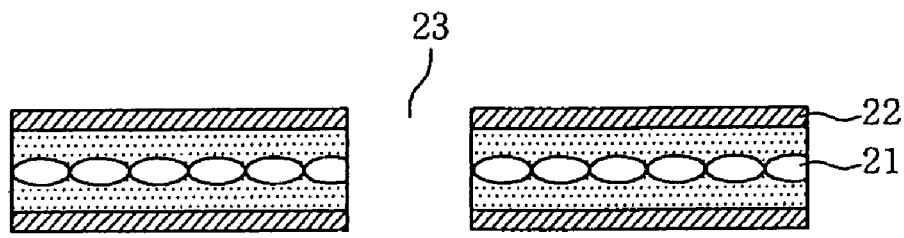
FIG.3C - Prior Art
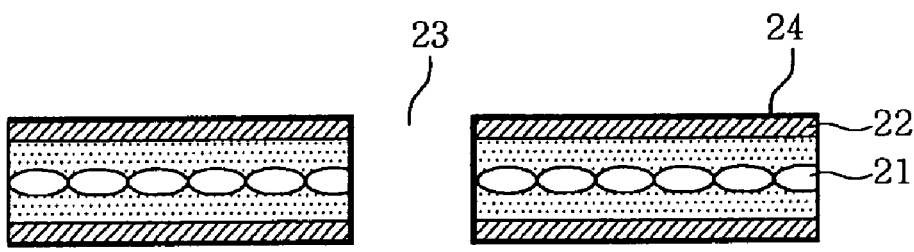
FIG.3D - Prior Art
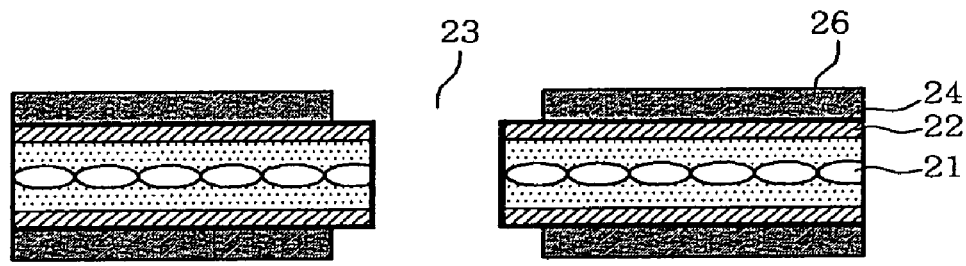
FIG.3E - Prior Art
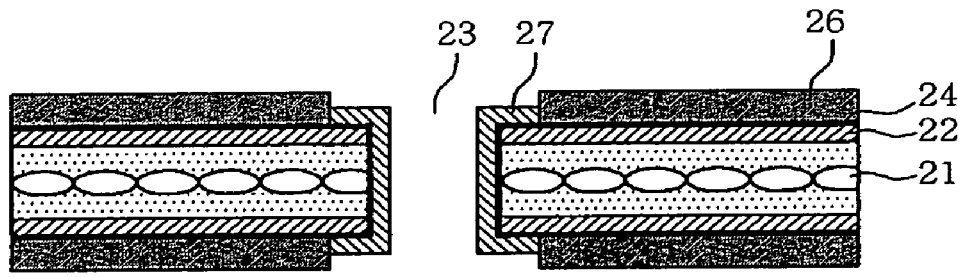

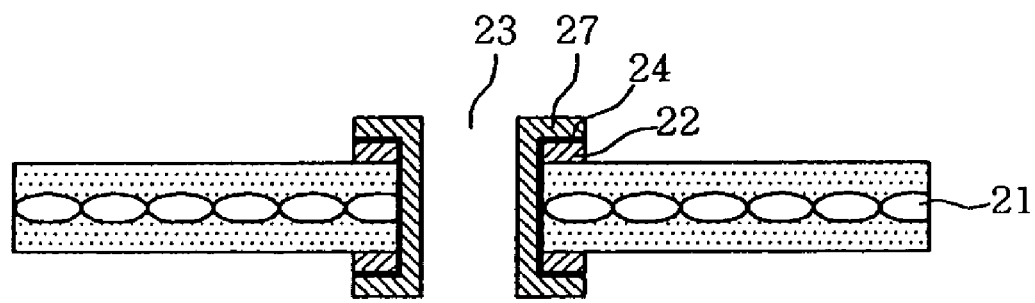
FIG.3F - Prior Art

FIG.4A - Prior Art      FIG.4B - Prior Art
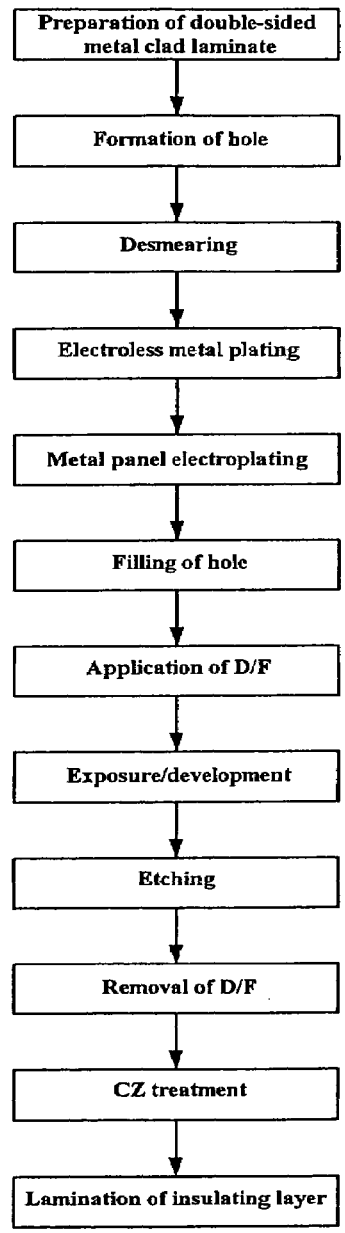
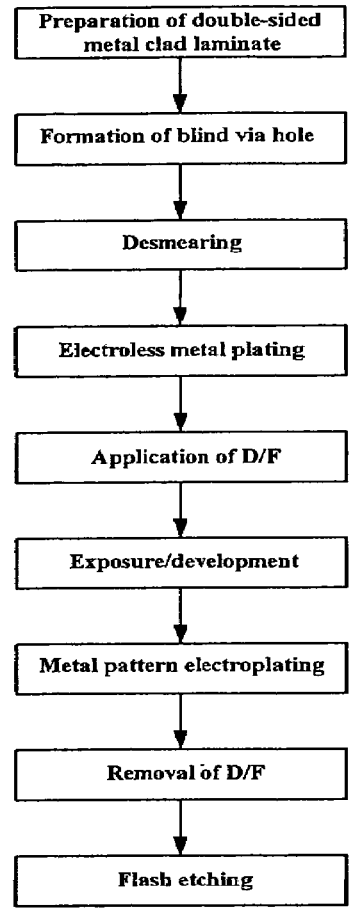

FIG.5A – Prior Art
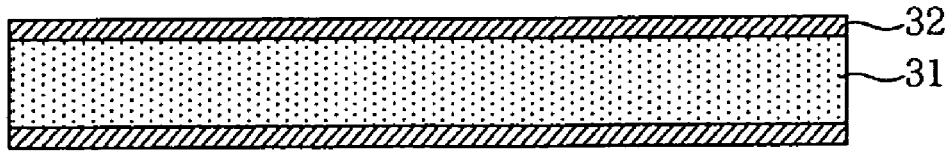
FIG.5B – Prior Art
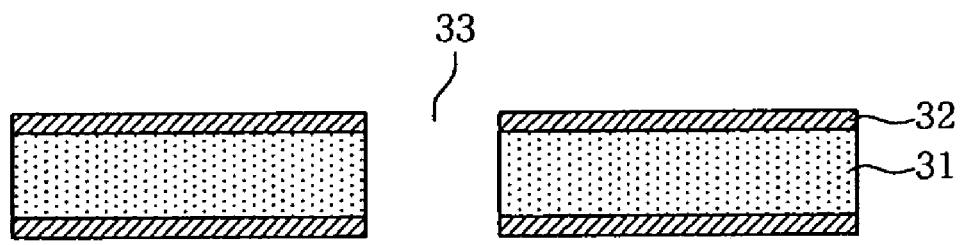
FIG.5C – Prior Art
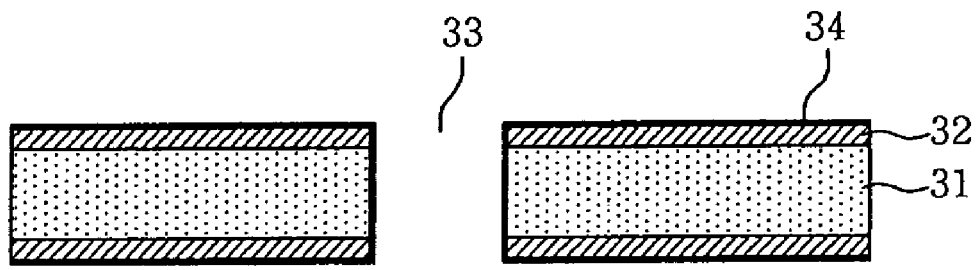
FIG.5D – Prior Art
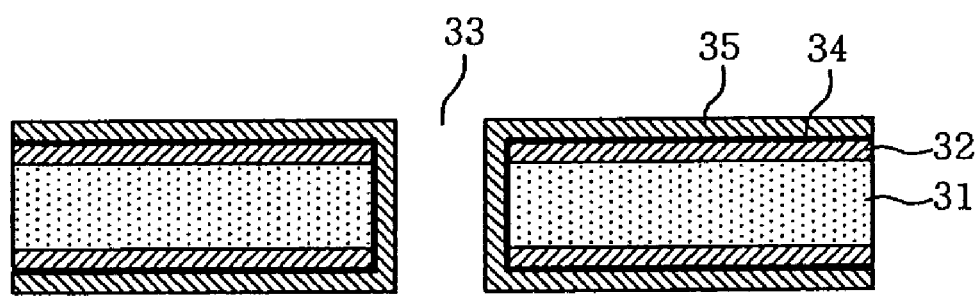

FIG.5E – Prior Art
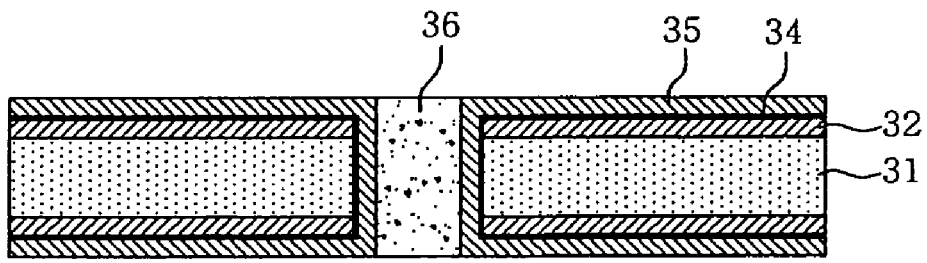
FIG.5F – Prior Art
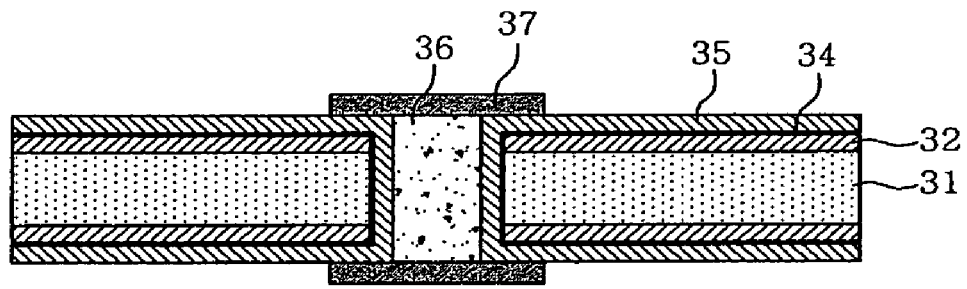
FIG.5G – Prior Art
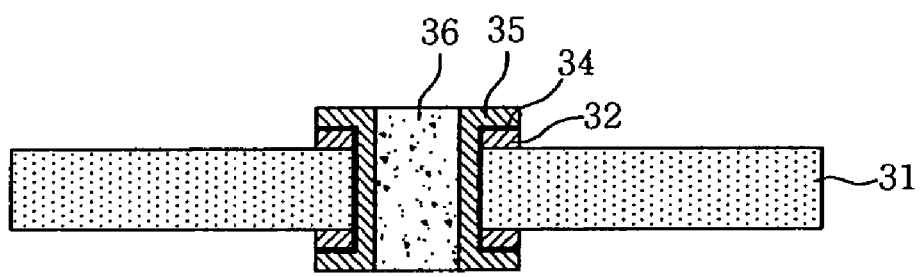
FIG.6A – Prior Art
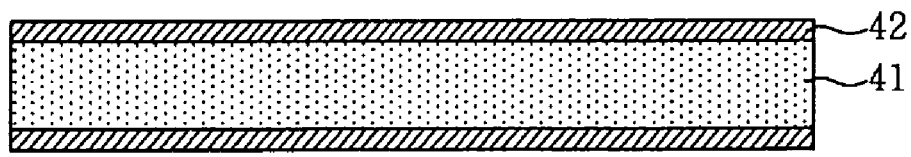

FIG. 6B – Prior Art
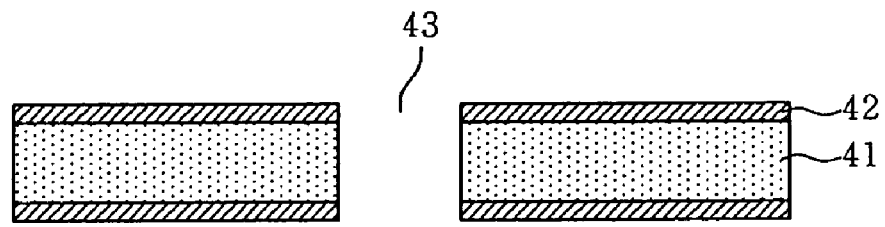
FIG. 6C – Prior Art
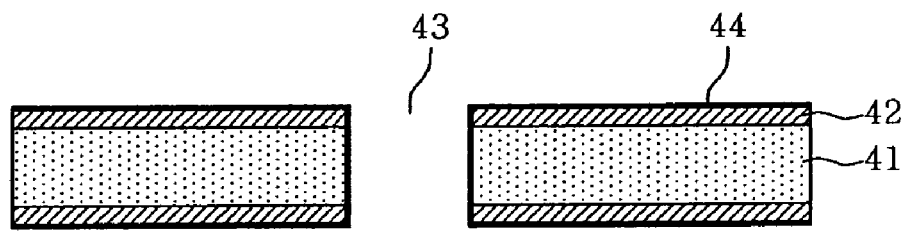
FIG. 6D – Prior Art
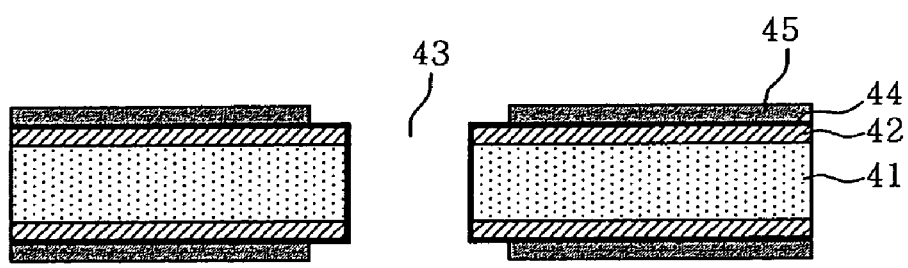
FIG. 6E – Prior Art
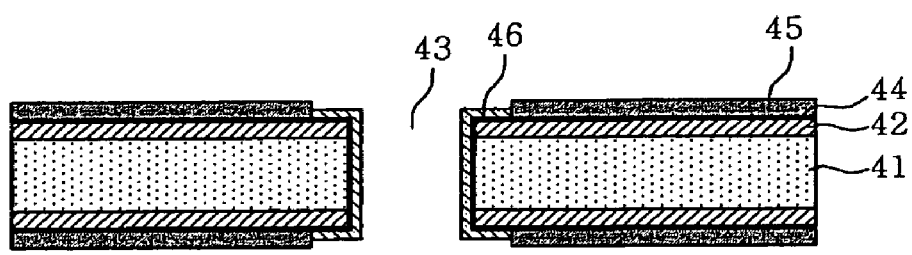

FIG.6F – Prior Art
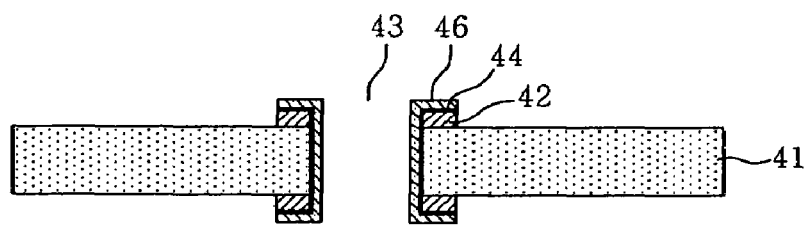
FIG.7 – Prior Art
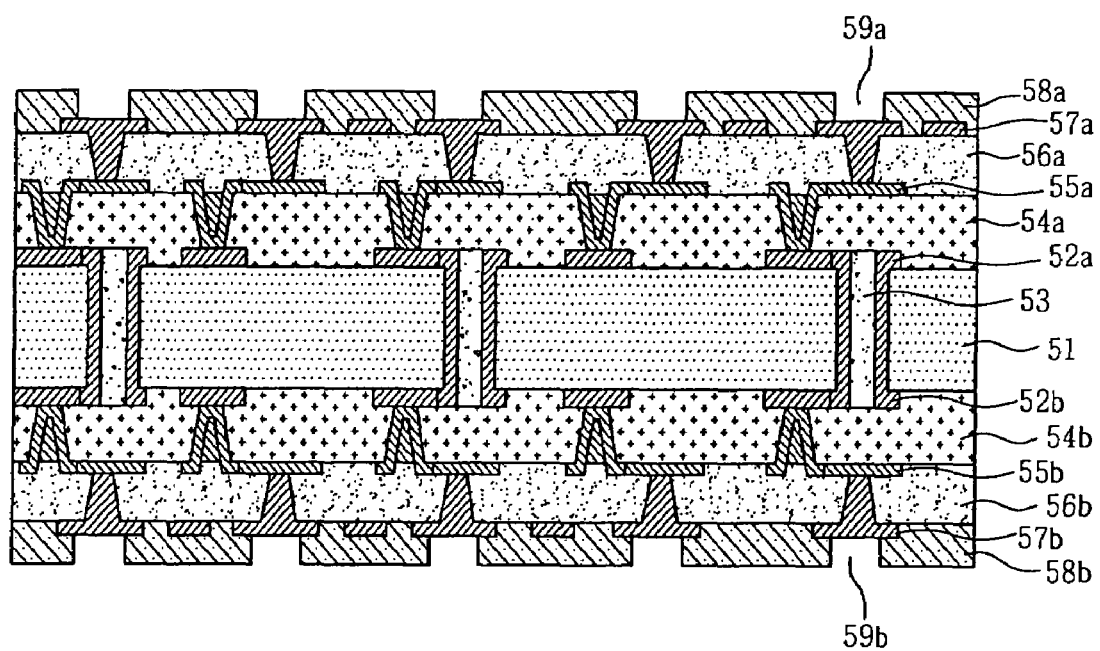

METHOD OF MANUFACTURING BUILD-UP PRINTED CIRCUIT BOARD

CROSS REFERENCE TO RELATED APPLICATION

This application claims the benefit of Korean Patent Application No. 10-2006-0042015, filed May 10, 2006, entitled "Process for Build-up Printed Circuit Board", which is hereby incorporated by reference in its entirety into this application.

BACKGROUND OF THE INVENTION

1. Field of the Invention

The present invention relates, in general, to a method of manufacturing a build-up printed circuit board (build-up PCB), and more particularly, to a method of manufacturing a build-up PCB, in which the core circuit layer of a build-up PCB is formed through a dry metal seed layer forming process including ion beam surface treatment and vacuum deposition, thereby realizing a highly reliable fine circuit in an environmentally friendly manner.

2. Description of the Related Art

Presently, build-up PCBs have been manufactured using a subtractive process, a modified semi-additive process (MSAP), and a semi-additive process (SAP).

In particular, a subtractive process is applied to HDI (high density interconnection) products, and a subtractive process and MSAP are applied to UT-CSP (ultra thin-chip scale package) and BGA (ball grid array) products. Further, in the case of FCBGA (flip chip BGA), a core layer and a build-up outer layer including 2F2B/3F3B are formed using a subtractive process and SAP, respectively, and furthermore, a seed layer is formed through electroless plating, thereby realizing a fine circuit.

In this regard, according to a first conventional technique, FIGS. 1A and 1B are flowcharts respectively illustrating the processes of forming the core layer and the outer layer of a build-up PCB.

With reference to FIG. 1A and FIGS. 2A to 2G, the method of forming the core layer of the build-up PCB using a subtractive process according to the first conventional technique is described below.

First, a resin substrate 11 having metal layers 12 laminated on both surfaces thereof is subjected to typical etching and drilling to thus form a through hole 13 (FIGS. 2A and 2B). Subsequently, the surface of the substrate having the through hole 13 is subjected to desmearing and then electroless plating to thus form an electroless metal layer 14 (FIG. 2C). Through electroplating, a metal panel plating layer 15 is formed (FIG. 2D). The through hole 13 is filled with a conductive paste 16 (FIG. 2E), after which a dry film 17 is applied on a predetermined region corresponding to a circuit pattern, including the through hole 13 (FIG. 2F). The unnecessary portions of the metal layers are removed through typical exposure/development and etching, and then the dry film 17 is removed, thus completing the procedure for forming the core circuit layer (FIG. 2G). Before the following outer layer forming process is performed, the substrate is subjected to typical surface treatment, such as CZ treatment, as known in the art, and then an insulating layer is laminated thereon (not shown).

In addition, with reference to FIG. 1B and FIGS. 3A to 3F, the process of forming the outer layer of the build-up PCB using MSAP according to the first conventional technique is described below. For convenience, the description of the build-up process on the core layer is omitted, and only the outer layer forming process is described.

First, a resin substrate 21 having metal layers 22 laminated on both surfaces thereof is half-etched and then subjected to typical etching and drilling to thus form a blind via hole 23 (FIGS. 3A and 3B). Thereafter, the surface of the substrate having the blind via hole 23 is subjected to desmearing and then electroless plating to thus form an electroless metal layer 24 (FIG. 3C). Thereafter, a dry film 26 is applied on a predetermined region, other than the region corresponding to a circuit pattern, including the via hole 23 (FIG. 3D). Using the dry film as a resist, a metal pattern plating layer 27 is formed through electroplating (FIG. 3E). Thereafter, the dry film 26 is removed, and the unnecessary portions of the metal layers are removed through flash etching, thus completing the patterning process (FIG. 3F).

According to a second conventional technique, the processes of forming the core layer and the outer layer of a build-up PCB are illustrated in flowcharts of FIGS. 4A and 4B, respectively.

With reference to FIG. 4A and FIGS. 5A to 5G, the process of forming the core layer of the build-up PCB using a subtractive process according to the second conventional technique is described below.

First, a resin substrate 31 including metal layers 32 having a thickness of about 12 μm laminated on both surfaces thereof is subjected to typical etching and drilling, thus forming a through hole 13 having a diameter of about 350 μm (FIGS. 5A and 5B). Subsequently, the surface of the substrate having the through hole 33 is subjected to desmearing and then electroless plating, thus forming an electroless metal layer 34 about 1~3 μm thick (FIG. 5C). Through electroplating, a metal panel plating layer 35 about 18 μm thick is formed (FIG. 5D). The through hole 33 having the electrolytic metal layer 35 is filled with a conductive paste 36 (FIG. 5E), after which a dry film 37 is applied on a predetermined region corresponding to a circuit pattern, including the through hole 33 (FIG. 5F). The unnecessary portions of the metal layers are removed via typical exposure/development and etching, and then the dry film 37 is removed, thereby completing the procedure for forming the core circuit layer (FIG. 5G). Before the following outer layer forming process progresses, the substrate is subjected to typical surface treatment, such as CZ treatment, as known in the art, and then an insulating layer is laminated thereon (not shown).

In addition, with reference to FIG. 4B and FIGS. 6A to 6F, the process of forming the outer layer of the build-up PCB using SAP according to the second conventional technique is described below. For convenience, the description of the build-up process on the core layer is omitted, and only the outer layer forming process is described.

First, a resin substrate 41 having metal layers 42 laminated on both surfaces thereof, for example, an ABF (Ajinomoto Build-up Film) about 35 μm thick, is subjected to typical etching and drilling to form a blind via hole 43 having a diameter of about 75 μm (FIGS. 6A and 6B). Then, the surface of the substrate having the blind via hole 43 is subjected to desmearing and then electroless plating, therefore forming an electroless metal layer 44 about 1±0.3 μm thick (FIG. 6C). Then, a dry film 45 is applied on a predetermined region, other than the region corresponding to a circuit pattern including the blind via hole 43 (FIG. 6D). Using the dry film as a resist, a metal pattern plating layer 46 is formed through electroplating (FIG. 6E). Then, the dry film 45 is removed, and the unnecessary portions of the metal layers are removed through flash etching, thus completing the patterning process (FIG. 6F).

As such, examples of the material for resin substrate depending on the type of product include epoxy resins, such as FR-4, BT (Bismaleimide Triazine), ABF, etc.

For instance, in the case of BGA and UT-CSP produced through a subtractive process and MSAP, which comprises a BT insulating material, the surface profile of the material is at least 1 μm, and in the subtractive process, a fine circuit having a pitch not larger than 80 μm (line/space=40/40 μm) is difficult to realize. In the MSAP, since the thickness of the metal layer varies due to half-etching, a fine circuit having a pitch on the order of about 50 μm (line/space=25/25 μm) may be obtained.

In the group of FCBGA products, the core layer is typically formed using an FR-4 resin substrate through a subtractive process to thus realize a circuit having a pitch of about 100 μm (line/space=50/50 μm), and the build-up outer layer is prepared using an ABF resin substrate through SAP to attain a fine circuit having a pitch of about 36 μm (line/space=18/18 μm). As such, however, the fine circuit of the core layer is difficult to realize, attributable to the surface roughness of the resin substrate material and the limitation of the subtractive process itself.

Further, in the group of FCBGA products, in which a multilayered substrate is manufactured using an ABF insulating material through SAP, as illustrated in FIG. 7, a subtractive process is applied to a core layer (which is composed of $1^{st}$~$2^{nd}$ layers 52a, 52b), and SAP is applied to an outer layer (which is composed of $3^{rd}$~$6^{th}$ layers 55a, 55b, 57a, 57b). In particular, in order to form the circuit, the outer layer forming process, comprising electroless plating for forming a seed layer about 1~3 μm thick, plating, stripping, and flash etching, is repeated two times. Thereby, via holes 53 and circuit patterns 52a, 52b, 55a, 55b, 57a, 57b are formed in resin substrates 51, 54a, 54b, 56a, 56b. Subsequently, an solder resist 58a, 58b is applied and a solder resist open part 59a, 59b is formed. Thereby, a FCBGA having a total of six layers is completed.

However, the use of expensive ABF material results in increased process cost and thus a high product price. In the case in which the SAP is applied, the surface profile of the ABF material is at least 1 μm, leading to a large surface roughness and a pitch of 36 μm (line/space=18/18 μm). Further, there are limitations in realizing a fine circuit through wet surface treatment and electroless chemical plating.

With the demand for light, slim, short and small PCBs, many manufacturers have attempted to develop insulating material for realizing a fine circuit and exhibiting high functionality in order to increase signal transfer rates on circuits. According to the above development trend, the number of signals that are input and output is increased, and thus highly reliable fine circuit is required. However, conventional SAP suffers because a metal seed layer is formed through a wet process including wet surface treatment and electroless plating, undesirably increasing the surface roughness, thus making it impossible to realize a fine circuit. As well, a large amount of waste is generated, causing environmental problems.

SUMMARY OF THE INVENTION

Leading to the present invention, intensive and extensive research into processes for build-up PCBs, carried out by the present inventors aiming to avoid the problems encountered in the related art, resulted in the finding that, when forming the core layer of a build-up PCB, a resin substrate having metal layers laminated on both surfaces thereof is full-etched to thus attain a surface roughness suitable for realizing high peel strength, and then a circuit layer is formed through SAP, in place of a conventional subtractive process, provided that a metal seed layer is formed through a dry process, including ion beam surface treatment and vacuum deposition, without the use of a conventional wet process, including wet etching and electroless plating, thereby manufacturing a build-up PCB having a highly reliable fine circuit in an environmentally friendly manner.

Accordingly, an object of the present invention is to provide a method of manufacturing a build-up PCB, in which all circuit layers of a build-up PCB including a core layer and an outer layer can be manufactured through SAP, thus realizing a fine circuit.

Another object of the present invention is to provide a method of manufacturing a build-up PCB, in which a metal seed layer can be formed not through a wet process but through a dry process, thus realizing a circuit layer in an environmentally friendly and economical manner.

A further object of the present invention is to provide a method of manufacturing a build-up PCB, in which the peel strength between a resin substrate and a metal layer can be increased, thus realizing a highly reliable fine circuit.

In order to accomplish the above objects, the present invention provides a method of manufacturing a build-up PCB comprising a core layer and an outer layer, the core layer being manufactured by (a) providing a first resin substrate having metal layers laminated on two surfaces thereof, (b) removing the metal layers from the two surfaces of the first resin substrate; (c) forming a through hole for interlayer electrical connection in the first resin substrate, having no metal layers; (d) subjecting the first resin substrate having the through hole to surface treatment using ion beams; (e) forming a first metal seed layer on the first resin substrate which is surface treated, using vacuum deposition; (f) forming a first metal pattern plating layer on the substrate having the first metal seed layer using electroplating; (g) removing a portion of the first metal seed layer, having no first metal pattern plating layer; and (h) filling the through hole with a conductive paste, thus forming a core circuit layer.

As such, the surface treatment using ion beams is preferably performed in the presence of an inert gas selected from the group consisting of Ar, $O_2$, $N_2$, Xe, $CF_4$, $H_2$, Ne, Kr and mixtures thereof.

The vacuum deposition may be performed using sputtering, thermal evaporation or e-beam deposition.

The first metal seed layer is preferably 0.02~4 μm thick, and more preferably 0.02~1 μm thick.

Further, the outer layer may be manufactured by (i) laminating a second resin substrate on the core circuit layer; (j) forming a blind via hole for interlayer electrical connection in the second resin substrate; (k) forming a second metal seed layer on the second resin substrate having the blind via hole using electroless plating; (l) forming a second metal pattern plating layer on the substrate having the second metal seed layer using electroplating; and (m) removing a portion of the second metal seed layer, having no second metal pattern plating layer.

The first resin substrate and the second resin substrate, which are the same as or difficult from each other, may comprise epoxy resin or fluorine resin.

Also, the metal is preferably copper.

BRIEF DESCRIPTION OF THE DRAWINGS

FIGS. 1A and 1B are flowcharts respectively illustrating the processes of forming the core layer and the outer layer of a build-up PCB, according to a first conventional technique;

FIGS. 2A to 2G are cross-sectional views sequentially illustrating the process of forming the core layer of the build-up PCB, according to the first conventional technique;

FIGS. 3A to 3F are cross-sectional views sequentially illustrating the process of forming the outer layer of the build-up PCB, according to the first conventional technique;

FIGS. 4A and 4B are flowcharts respectively illustrating the processes of forming the core layer and the outer layer of a build-up PCB, according to a second conventional technique;

FIGS. 5A to 5G are cross-sectional views sequentially illustrating the process of forming the core layer of the build-up PCB, according to the second conventional technique;

FIGS. 6A to 6F are cross-sectional views sequentially illustrating the process of forming the outer layer of the build-up PCB, according to the second conventional technique;

FIG. 7 is a cross-sectional view schematically illustrating the structure of a conventional FCBGA PCB;

DESCRIPTION OF THE PREFERRED EMBODIMENTS

Hereinafter, a detailed description will be given of the present invention, with reference to the appended drawings.

As mentioned above, in the conventional preparation of the core layer of a build-up PCB, according to a subtractive process, a circuit may be realized by subjecting a resin substrate, having metal layers laminated on both surfaces thereof, to the application of a dry film, exposure, development and wet etching, however it is difficult to attain a circuit line width having a pitch not larger than 80 μm (line/space=40/40 μm). In addition, with the aim of mitigating such fine circuit patterning problems, SAP is considered to be useful for forming a circuit in such a way that a substrate is subjected to via hole machining, desmearing, electroless plating for forming a metal seed layer, electroplating, and then flash etching. However, in the case where the SAP is applied to the formation of the circuit layer through a typical wet process, including electroless plating and electroplating, sufficient peel strength between the resin substrate and the metal layer is not assured, and it is difficult to realize a fine circuit.

In the present invention, to overcome the above-mentioned problems, when the core layer is prepared through SAP, the metal layers laminated on two surfaces of the resin substrate for the core layer are full-etched to thus impart surface roughness suitable for realizing high peel strength, after which a metal seed layer is formed using a dry process, including ion beam surface treatment and vacuum deposition, in place of a conventional wet process, including desmearing and electroless plating. Thereby, through environmentally friendly SAP, the peel strength (>0.8 Kgf/cm) on metal can be increased, ultimately making it possible to realize a fine circuit having high density. Further, in the build-up outer layer, a circuit layer is formed using conventional wet desmearing, electroless plating and electroplating. In this way, since SAP can be applied to all of the layers of the build-up PCB, a fine circuit having a high density can be obtained.

Figure 8A:
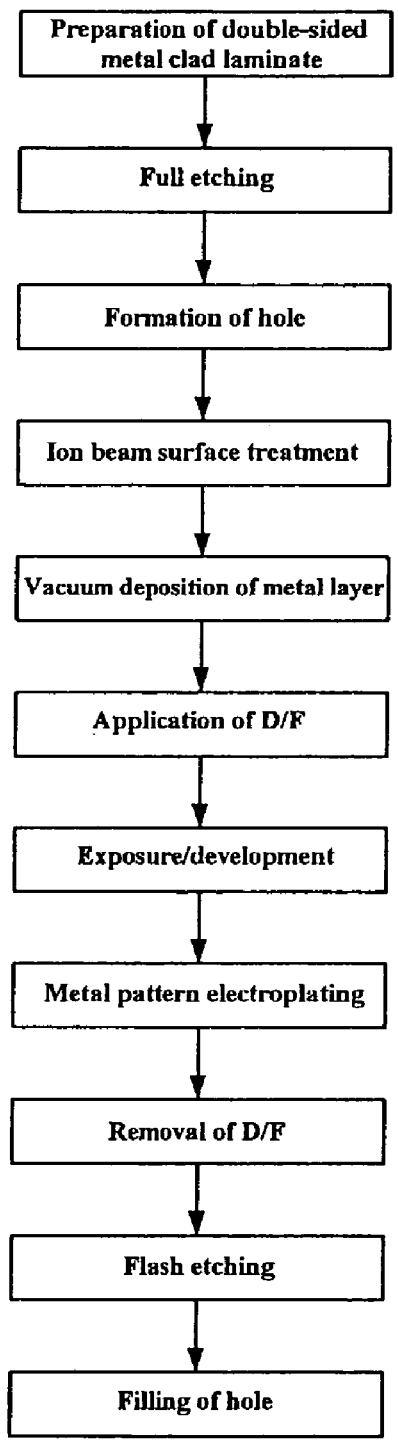
FIGS. 8A and 8B are flowcharts respectively illustrating the processes of forming the core layer and the outer layer of a build-up PCB, according to the present invention.
Figure 8B:
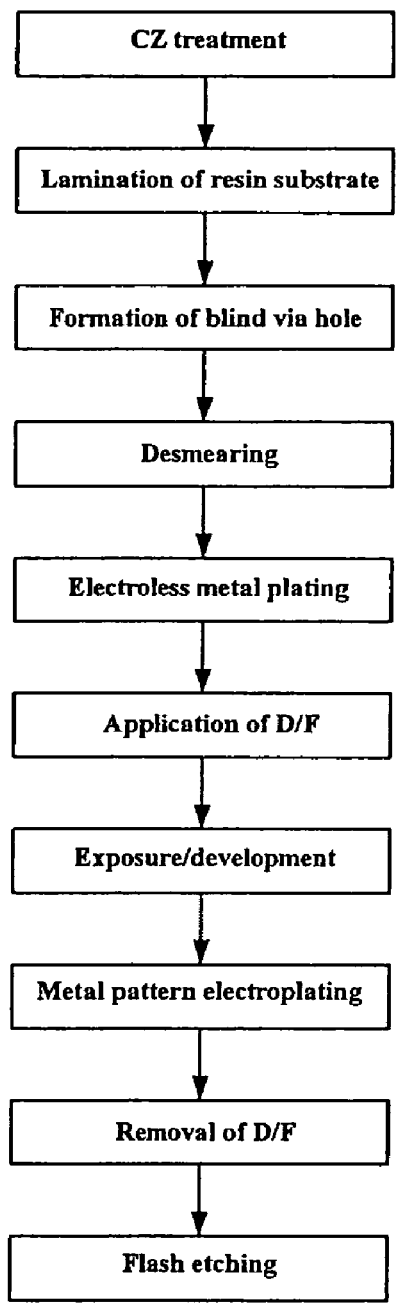

FIGS. 8A and 8B are flowcharts respectively illustrating the processes of forming the core layer and the outer layer of the build-up PCB, according to the present invention.

Referring to FIG. 8A and FIGS. 9A to 9H, the process of forming the core layer of the build-up PCB according to the present invention is described below.

Figure 9A:
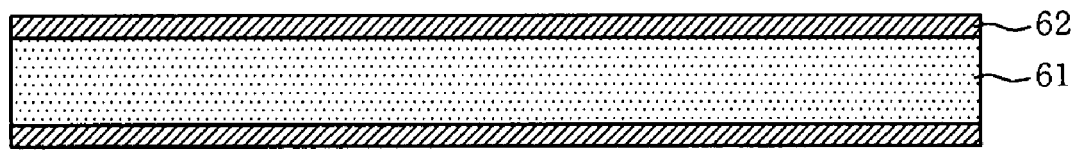
FIGS. 9A to 9H are cross-sectional views sequentially illustrating the process of forming the core layer of the build-up PCB, according to the present invention.

First, a resin substrate 61 for a PCB, which is formed of epoxy resin or fluorine resin and has metal layers 62 laminated on two surfaces thereof, is prepared (FIG. 9A). As the metal, any conductive metal may be used as long as it is applicable for circuit formation. In consideration of economic benefits, copper is particularly useful.

Figure 9B:
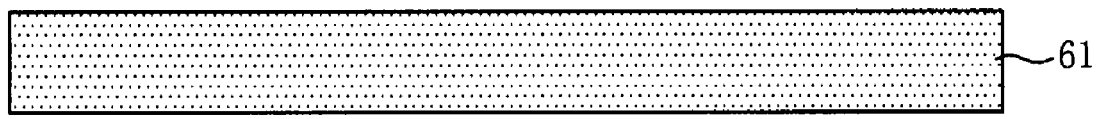
Figure 9C:
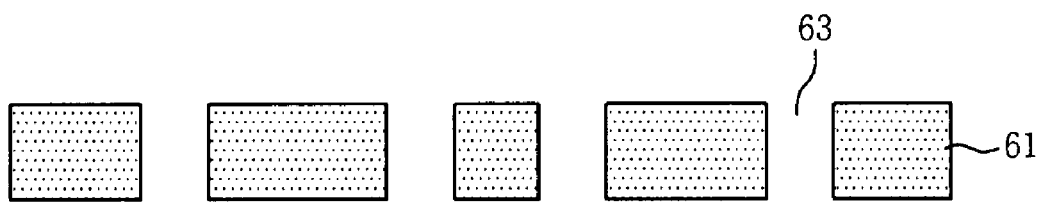

Then, the metal layers 62 are removed from the two surfaces of the resin substrate 61 through a typical full-etching process. Thereby, even without additional surface treatment, the substrate may be imparted with a surface roughness suitable for realizing high peel strength (FIG. 9B).

Subsequently, one or more through holes 63 for inner via holes for interlayer electrical connection are formed in the resin substrate 61 (FIG. 9C), and the surface of the substrate having the through holes 63 is treated using ion beams.

Preferably, the ion beam surface treatment procedure may be conducted at an ion dose of 1E15~1E19 (ions/$cm^2$) and an acceleration voltage of 0.5~20 keV in the presence of an inert gas selected from the group consisting of Ar, $O_2$, $N_2$, Xe, $CF_4$, $H_2$, Ne, Kr and mixtures thereof, but the present invention is not limited thereto. The actual process conditions may be appropriately set depending on the type of substrate material, which will be apparent to those skilled in the art.

Figure 12:
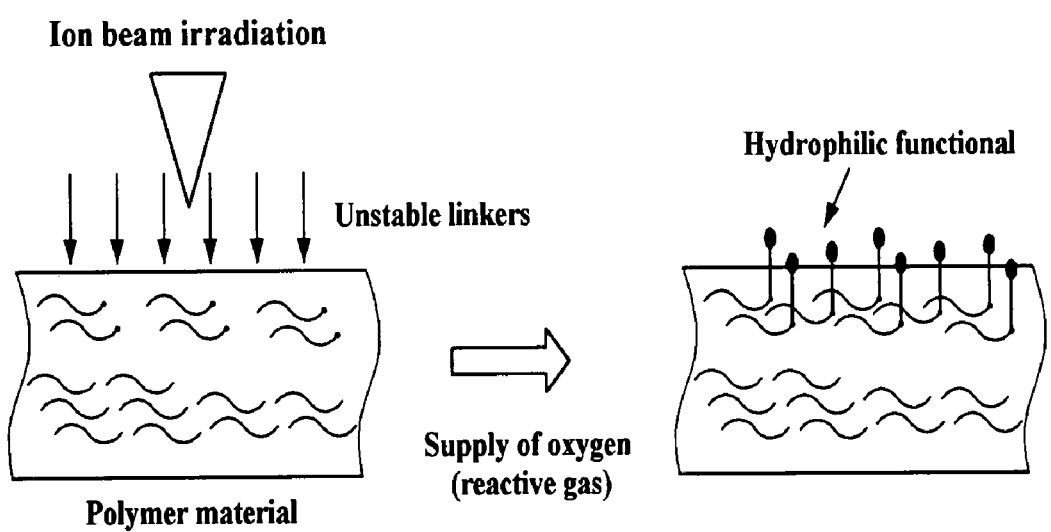
FIG. 12 is a view schematically illustrating the ion beam surface treatment of the PCB according to the present invention.

Through such a dry ion beam surface treatment procedure, the peel strength of the resin substrate to the subsequently formed metal seed layer can be increased. That is, as illustrated in FIG. 12, the surface of the polymer material for the resin substrate is excited using inert or reactive ions having energy to thus form unstable linkers, which are allowed to chemically react with reactive gas (e.g., oxygen), so that the hydrophobic surface of the substrate is converted into hydrophilicity, therefore increasing the peel strength of the material. Thereby, it is possible to realize a fine circuit.

Figure 9D:
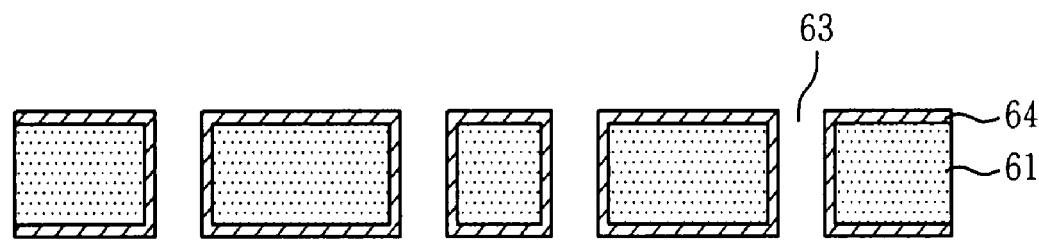
Figure 9E:
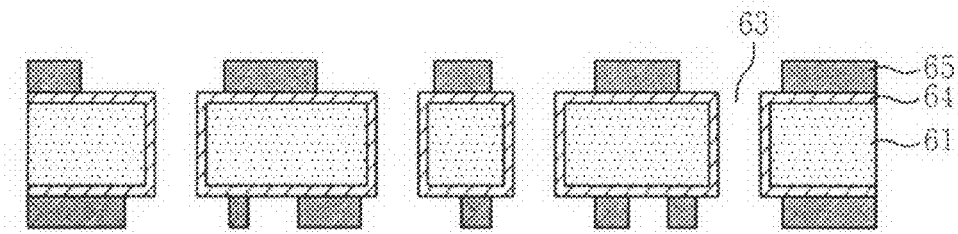
Figure 9F:
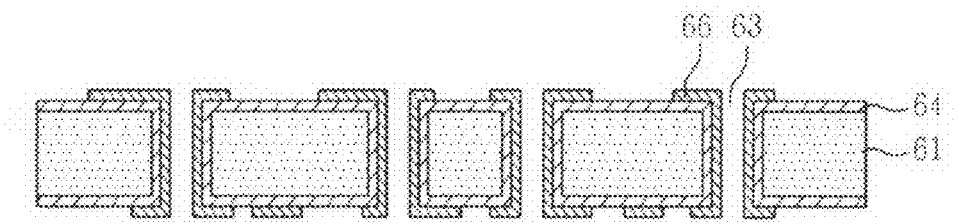
Figure 9G:
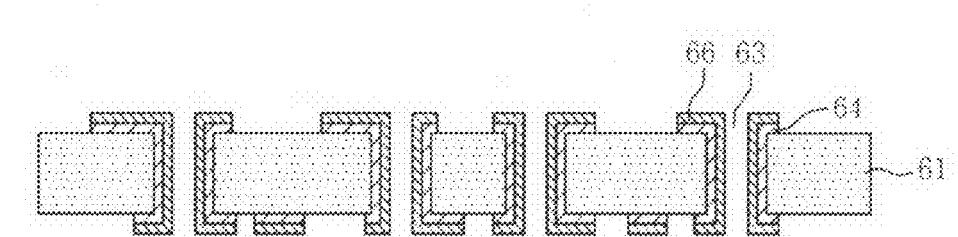

On the ion beam surface treated substrate 61, a metal seed layer 64 is formed to a desired thickness using vacuum deposition (FIG. 9D).

The vacuum deposition process is exemplified by sputtering, thermal evaporation or e-beam deposition, but is not particularly limited thereto as long as the method is known in the art.

The metal seed layer thus formed has a thickness of 0.02~4 μm, preferably 0.02~1 μm, and more preferably 0.02~0.5 μm. In particular, the metal seed layer, resulting from vacuum deposition, may be selectively formed to be thinner than a metal seed layer formed using a conventional wet electroless plating process (2~3 μm), and thereby a working time period can be decreased in a subsequent flash etching process, productivity can be increased, and the generation of undercutting can be prevented, consequently obtaining fine core circuit wires having high density. Further, a dry vacuum deposition process, which can replace a conventional wet electroless plating process and thus can be used in the formation of the metal seed layer, is considered to be environmentally friendly because no waste liquid is generated.

Subsequently, as known in the art, a dry film 65, functioning as a plating resist, is applied on a predetermined region, other than the pattern plating region (FIG. 9E), after which an electrolytic metal pattern is plated and the dry film 65 is removed, hence a metal pattern plating layer 66 (FIG. 9F) is formed.

Figure 9H:
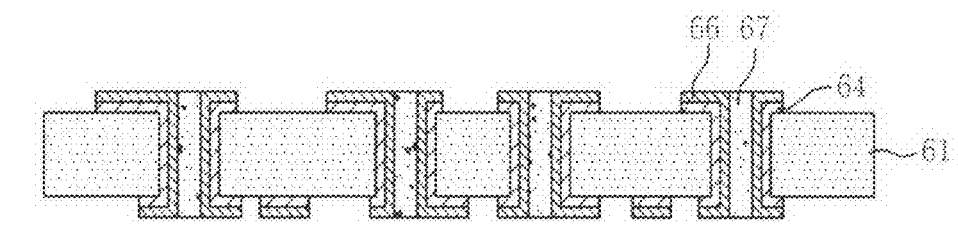

The portion of the metal seed layer 64, having no pattern plating layer 66, is removed through typical flash etching (FIG. 9G), and the through hole 63 having the pattern plating layer 66 is filled with a typical conductive paste 67 known in the art, consequently completing a core circuit layer (FIG. 9H).

Turning to FIG. 8B and FIGS. 10A to 10F, the process of building up the outer layer on the core layer of the build-up PCB according to the present invention is described below.

Figure 10A:
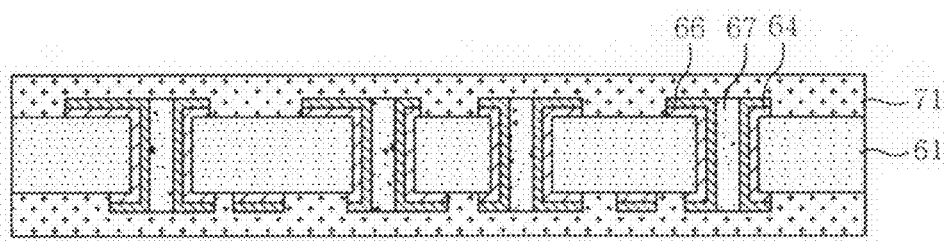
FIGS. 10A to 10F are cross-sectional views sequentially illustrating the process of forming the first outer layer on the core layer of FIG. 9H.

The core circuit layer of FIG. 9H is subjected to typical surface treatment, such as CZ treatment (CZ8100, available from MEC), to increase the surface roughness of the circuit layer so as to assure peel strength to material for a resin substrate, after which a substrate 71 formed of epoxy resin or fluorine resin, which is the same as or different from that of the core layer, is laminated thereon (FIG. 10A).

Figure 10B:
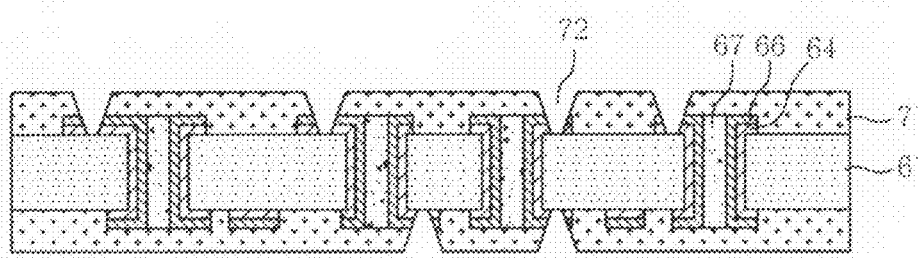
Figure 10C:
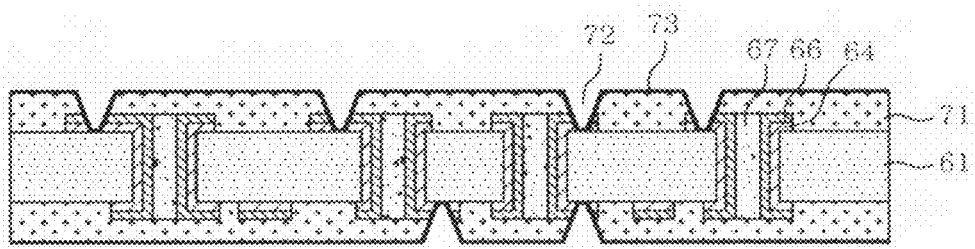

Subsequently, blind via holes 72 for interlayer electrical connection are formed in the resin substrate 71 (FIG. 10B). After typical surface treatment through a desmearing process, an electroless plating process is performed, thus obtaining a metal seed layer 73 about 2~3 μm thick (FIG. 10C).

Figure 10D:
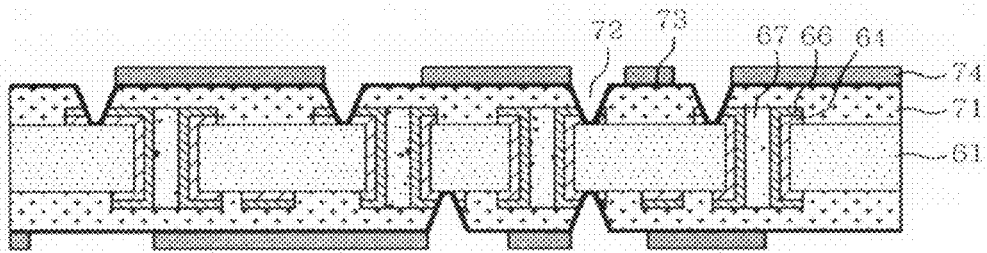
Figure 10E:
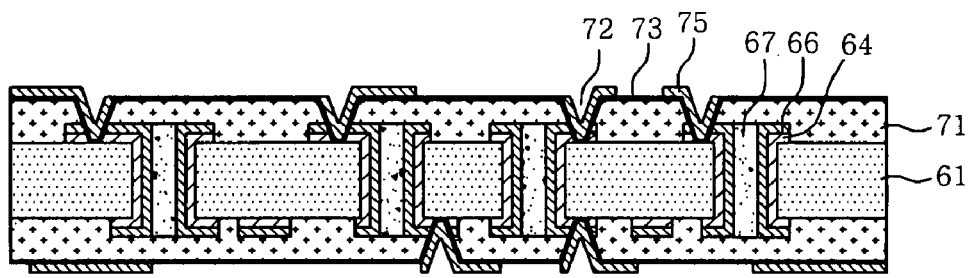

Subsequently, a dry film 74 is applied on a predetermined region, other than the region corresponding to a circuit pattern including the blind via holes 72 (FIG. 10D). Using the dry film as a resist, a metal pattern plating layer 75 is formed through electroplating (FIG. 10E).

Figure 10F:
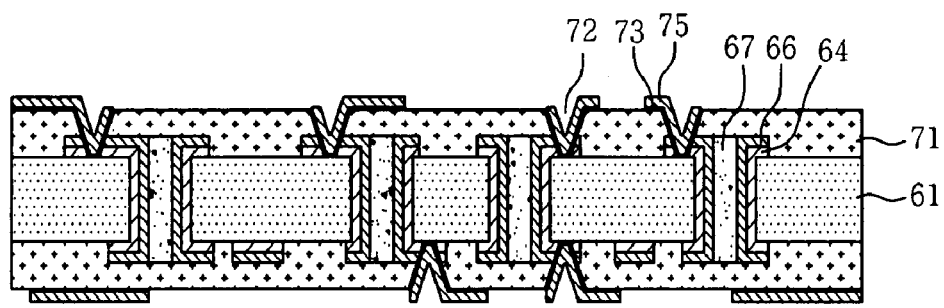

Subsequently, the dry film 74 is removed, and the portion of the metal seed layer 73, having no metal pattern plating layer 75, is removed through typical flash etching, thereby completing an outer circuit layer (FIG. 10F).

Selectively, the SAP shown in FIGS. 10A to 10F may be repeated two times to thus form a $3^{rd}$ layer to a $6^{th}$ layer. In addition, when the outermost layer of the FCBGA is applied, a solder resist is applied, a solder resist open part is formed through a typical solder resist opening process, and then a bump may be formed through electroless nickel/gold plating, as is typically known in the art.

Figure 11:
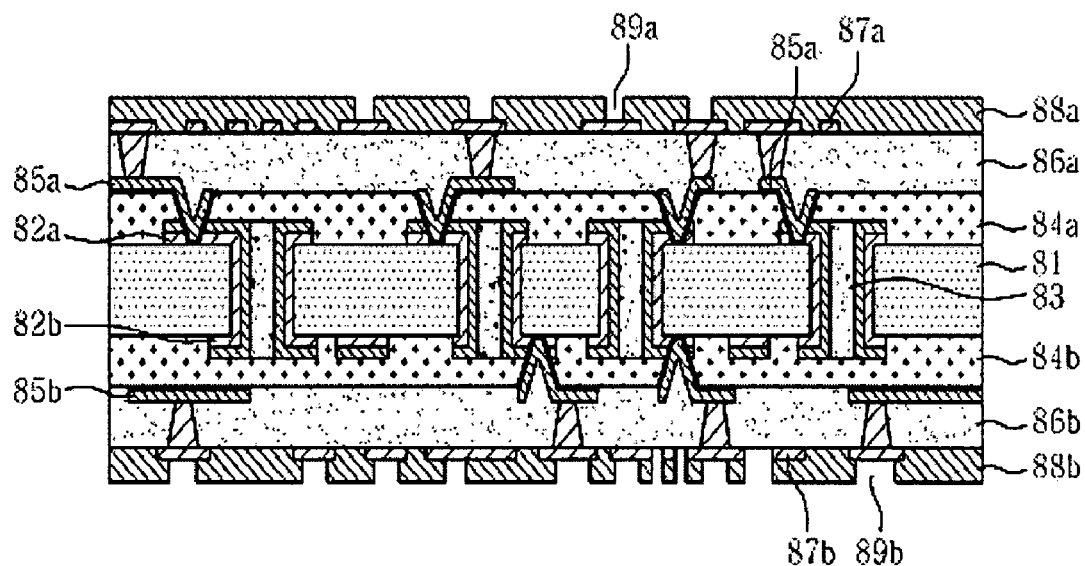
FIG. 11 is a cross-sectional view schematically illustrating the structure of an FCBGA PCB manufactured by forming the second outer layer on the first outer layer of FIG. 10F.

The FCBGA having six layers thus manufactured is illustrated in FIG. 11.

As illustrated in FIG. 11, as the core layer, a first resin substrate 81 including a first circuit layer 82a, 82b and via holes 83 is provided, and as the outer layer, a second resin substrate 84a, 84b including blind via holes and a second circuit layer 85a, 85b, and a third resin substrate 86a, 86b including blind via holes and a third circuit layer 87a, 87b, are provided. In addition, as the outermost layer, a solder resist 88a, 88b is provided, and a solder resist open part 89a, 89b is formed through a predetermined opening process.

Depending on the end use of a build-up PCB, the outer layer build-up process may be repeated several times, and a predetermined subsequent process may be further performed.

The build-up PCB thus manufactured may be applied to HDI, UT-CSP, BGA, FCBGA, etc., and, as well, may be applied to all products for realizing fine circuits without limitation thereto.

According to the process of manufacturing the build-up PCB of the present invention, since the resin substrate having metal layers laminated on two surfaces thereof is used as the substrate for the core layer in a state in which the metal layers are removed therefrom, the resin substrate may be imparted with a surface roughness (Ra<0.8 μm) suitable for realizing high peel strength without additional surface treatment. Further, the surface of the substrate thus roughened is treated using ion beams, thereby increasing the peel strength to the metal (>0.8 Kgf/cm), resulting in realization of a fine circuit. Furthermore, the metal seed layer can be formed using a dry process, instead of a conventional wet process, so that the fine circuit of the core layer can be realized with a minimum surface roughness (Ra<0.8 μm) through an environmentally friendly process. Moreover, all of the layers of the build-up PCB, including the core layer and the outer layer, can be subjected to SAP to thus form a circuit. Consequently, it is possible to realize a highly reliable fine circuit having high density.

A better understanding of the present invention may be obtained by way of the following examples, which are set forth to illustrate, but are not to be construed to limit, the present invention.

EXAMPLE 1

A. An FR-4 CCL (copper clad laminate) having copper foil laminated on two surfaces thereof was full-etched using an $FeCl_2$ etchant, thus removing the two layers of copper foil. The FR-4 substrate having no copper foil was subjected to mechanical drilling using a CNC (Computer Numerical Control) drill to thus form a via hole having a diameter of about 100~300 μm, and then to ion beam surface treatment at an acceleration voltage of about 1 KeV and an ion dose of 1E15 using $N_2$ gas. Thereafter, on the surface treated substrate, a Cu seed layer was deposited to a thickness of about 0.3 μm using DC sputtering. Subsequently, a copper pattern plating layer about 10~20 μm thick was formed through copper pattern electroplating with $H_2SO_4$ (120~160 gl/l), Cu (20~40 g/l), $Cl^-$ (20~50 ppm), and a cupracid HL leveller (5~15 ml/l), under conditions of a predetermined air flow volume (0.05~0.15 $m^3$/min), temperature (20~25° C.), and current density (F/B1.5ASD), after which the Cu seed layer was removed through flash etching at an etching speed of 2 m/min using an $H_2SO_4/H_2O_2$ etchant. Finally, the via hole was filled with a copper paste under conditions of viscosity of 3.0 pa·s, preheating treatment at 80° C./60 min, and curing at 160° C./60 min, thus completing a core circuit layer.

B. The core circuit layer thus obtained was subjected to CZ treatment (CZ8100, available from MEC) to increase the surface roughness of copper so as to assure peel strength to substrate material. On such a core circuit layer, ABF was temporarily welded under conditions of temperature of 100° C., vacuum time period of 30 sec, pressure of 7 kgf/$cm^2$, and pressing time period of 60 sec using a primary vacuum lamination apparatus, and then laminated under conditions of temperature of 100° C., pressure of 10 kgf/$cm^2$, and pressing time period of 90 sec using a secondary hot press. Subsequently, using a $CO_2$ laser, a blind via hole having a diameter of about 70 μm was formed, and, in a sweller process, smears were swollen at 10~12 of pH and then removed using permanganic acid ($CH_4+12MnO_4^-+14OH^- \rightarrow CO_3^{2-}+12MnO_4^{2-}+9H_2O+O_2$) to thus form a predetermined surface roughness. Thereafter, via neutralization for removal of the manganese dioxide residue ($CH_4+12MnO_4^-+14OH^- \rightarrow CO_3^{2-}+12MnO_4^{2-}+9H_2O+O_2$), desmearing treatment was performed, and electroless copper plating (Atotech) was performed under conditions of $CuSO_4+2HCHO+4NaOH \leftrightarrow Cu+2HCO_2Na+H_2+2H_2O+Na_2SO_4$, thereby forming a Cu seed layer about 3 μm thick. Subsequently, through copper pattern electroplating (Evara) with $H_2SO_4$ (120~160 gl/l), Cu (20~40 g/l), $Cl^-$ (20~50 ppm), and a cupracid HL leveller (5~15 ml/l), under conditions of a predetermined air flow volume (0.05~0.15 $m^3$/min), temperature (20~25° C.), and current density (F/B1.5ASD), a copper pattern plating layer about 15 μm thick was formed, after which the Cu seed layer was removed through flash etching at an etching speed of 2 m/min using an $H_2SO_4/H_2O_2$ etchant.

C. The substrate obtained in B was subjected two times to a build-up process that was the same as the process of B to thus form an outer layer composed of a $3^{rd}$ layer to a $6^{th}$ layer. Under conditions of roll pitch: 370 μm, 350 μm and 320 μm, roll press, doctor bar press, roll speed: 1.2~1.6 m/min, and dry temperature/time: 78° C.±2° C., a solder resist was applied and then pre-cured for a first tact time of 30 sec and a second tact time of 30 sec, so that the solvent was removed from the ink and thus the surface of the applied ink was partially cured and dried to thus be suitable for an exposure process. In the exposure process, UV light was radiated onto the surface of the applied ink at a light intensity of 700~900 $mJ/cm^2$ and thus passed through a work film/glass mask to induce photo-curing of ink so that the ink could play a role as a resist in a developing solution. In the developing process, the photo-cured portion of the ink was used as the resist in sodium carbonate ($Na_2CO_3$ 1%), whereas the non-photocured portion thereof was dissolved and removed. Used was a 1% $Na_2CO_3$ solution (1% sodium carbonate) under conditions of $Na_2CO_3$ concentration: 11±1.0 g/l (SPEC: 10.5±2.0 g/l), $Na_2CO_3$ pH: 10.0~12.5, $Na_2CO_3$ temperature: 30±3° C., developing pressure, and developing speed, and performed was UV curing (the surface of the developed ink was further photocured so that an insufficient light reaction was additionally induced upon UV exposure to increase SR properties). In order to improve the peel strength between the post-cured (completely dried) ink and the Cu and to increase the hardness of the ink, the double bond of the curing agent in the ink was activated, and all resins in the curing agent began to react in the post-curing process to result in a complete polymer. The conditions were temperature/time: 120° C./30 min and 150° C./60 min, the portion of the circuit pattern, corresponding to a bump, was opened through solder opening, after which electroless nickel plating under conditions of boric acid: 22~38 g/l, pH: 3.5~4.5, nickel sulfamate: 400~500 g/l, nickel chloride: 8~16 g/l, Fe: 200 ppm or less, Cu: 200 ppm or less, and temperature: 45~55° C., and then electroless gold plating under conditions of Au: 5.5~7.5 g/l, pH: 6.1~6.4, specific gravity: 1.09~1.24, Fe: 50 ppm or less, Cu: 18 ppm or less, Ni: 350 ppm or less, Zn: 5 ppm or less, Tl: 5~15 ppm, and temperature: 65~75° C., were sequentially conducted, consequently manufacturing an FCBGA.

The peel strength of the build-up PCB thus manufactured and the surface roughness of the insulating material were measured. The results are given in Table 1 below.

EXAMPLE 2

An FCBGA was manufactured in the same manner as in Example 1, with the exception that ion beam sputtering was used instead of the DC sputtering, in step A.

The peel strength of the build-up PCB thus manufactured and the surface roughness of the insulating material were measured. The results are given in Table 1 below.

COMPARATIVE EXAMPLE 1

An FCBGA was manufactured in the same manner as in Example 1, with the exception that, in step A, the ion beam surface treatment and the deposition using the DC sputtering were omitted, and the Cu seed layer was formed using a conventional wet process including desmearing and electroless copper plating, as described below.

The peel strength of the build-up PCB thus manufactured and the surface roughness of the insulating material were measured. The results are given in Table 1 below.

Desmearing

Sweller (functioning as a conditioner for optimal etching at pH 10~12, that is, acting to swell smears)→three-stage water washing→permanganic acid treatment (removal of main smears and a roughened resin surface)→one-stage water washing→two-stage water washing→neutralization (removal of manganese dioxide residue)→three-stage water washing→drying Electroless Copper Plating Cleaner (which is an alkali chemical cleaning process for high peel strength and a conditioning process for Pd adsorption)→three-stage water washing→etching cleaner (removal of Cu oxide layer and roughening for assuring peel strength between Cu layers)→three-stage water washing→pre-dipping (removal of persulfate residue and functioning as a pre-activator)→activator (Pd ion (non-colloidal type) adsorption)→three-stage water washing→reducer (reduction of Pd ion to Pd as a function as a catalyst)→three-stage water washing→chemical copper (formation of Cu ion into a Cu layer using Pd catalyst)→three-stage water washing→drying

TABLE 1

|  | Ex. 1 | Ex. 2 | C. Ex. 1 |
| --- | --- | --- | --- |
| Peel Strength | 0.8 kgf/cm | 1.0 kgf/cm | 0.5 kgf/cm |
| Surface Roughness | 0.9 μm | 0.9 (m | 1.0 (m |

As is apparent from Table 1, in the case where the build-up substrate was manufactured using a conventional wet process (Comparative Example 1), the peel strength was about 0.5 kgf/cm and surface roughness was 1.0 (m to thus enable the formation of a pitch of 36 (m (Line/Space=18/18 (m). However, in the case where the build-up substrate was manufactured using a dry process according to the present invention (Examples 1 and 2), the peel strength was about 0.9 kgf/cm and the surface roughness was relatively small, to the extent of 0.9 (m. Thereby, a fine circuit having a pitch of 20 (m (Line/Space=10/10 (m) can be realized and a faster signal transfer rate can also be attained.

Although the preferred embodiments of the present invention, with regard to the method of manufacturing the build-up PCB, have been disclosed for illustrative purposes, those skilled in the art will appreciate that various modifications, additions and substitutions are possible, without departing from the technical spirit of the invention.

As described hereinbefore, the present invention provides a method of manufacturing a build-up PCB. According to the present invention, a resin substrate having metal layers laminated on both surfaces thereof is full-etched and thus is imparted with surface roughness suitable for realizing high peel strength without additional surface treatment, after which the metal circuit layer of the core layer is formed through SAP, provided that the metal seed layer is formed using a dry process, including ion beam surface treatment and vacuum deposition, instead of a conventional wet process, including wet etching and electroless plating, thereby increasing the peel strength of the material.

Further, in the process of forming the metal seed layer using a conventional electroless plating process, since the layer is formed to be relatively thick, to the extent of about 3 μm, the time period required for flash etching, as a subsequent metal seed layer removal process, is increased, and undercutting problems may be caused. However, in the present invention, through ion beam surface treatment and vacuum deposition, a thinner metal seed layer can be formed, thereby reducing the process time period, leading to high productivity. As well, the undercutting problems can be overcome. Therefore, it is possible to realize a fine circuit pattern having high density.

Furthermore, conventional wet surface treatment and electroless plating are replaced with dry ion beam surface treatment and vacuum deposition, and thus peel strength to metal is increased (>0.8 Kgf/cm), thereby making it possible to realize a fine circuit, having a pitch not larger than 40 µm (line/space=20/20 µm), in an environmentally friendly manner.

In addition, since the core layer of the build-up substrate is also formed through SAP for high peel strength between the substrate and the metal circuit layer, all of the layers of the build-up substrate can be manufactured through SAP, and thus a highly reliable fine circuit can be assured.

The modifications, additions and substitutions fall within the scope of the present invention as disclosed in the accompanying claims.

What is claimed is:

1. A method of manufacturing a build-up printed circuit board comprising a core layer and an outer layer, the core layer being manufactured by:
    providing a first resin substrate having metal layers laminated on two surfaces thereof;
    removing the metal layers from the two surfaces of the first resin substrate through a full-etching process so that a surface roughness of the two surfaces is less than 0.8 µm;
    forming a through hole for interlayer electrical connection in the first resin substrate, having no metal layers;
    subjecting the first resin substrate having the through hole to surface treatment using ion beams so that a peel strength of the first resin substrate is greater than 0.8 Kgf/cm;
    forming a first metal seed layer on the first resin substrate which is surface treated, using vacuum deposition;
    forming a first metal pattern plating layer on the substrate having the first metal seed layer using electroplating;
    removing a portion of the first metal seed layer, having no first metal pattern plating layer; and
    filling the through hole with a conductive paste, thus forming a core circuit layer having a pitch not larger than 40 µm.

2. The method as set forth in claim 1, wherein the surface treatment using ion beams is performed in the presence of an inert gas selected from the group consisting of Ar, $O_2$, $N_2$, Xe, $CF_4$, $H_2$, Ne, Kr and mixtures thereof.

3. The method as set forth in claim 1, wherein the vacuum deposition is performed using sputtering, thermal evaporation or e-beam deposition.

4. The method as set forth in claim 1, wherein the first metal seed layer is 0.02~4 µm thick.

5. The method as set forth in claim 4, wherein the first metal seed layer is 0.02~1 µm thick.

6. The method as set forth in claim 1, wherein the outer layer is manufactured by:
    laminating a second resin substrate on the core circuit layer;
    forming a blind via hole for interlayer electrical connection in the second resin substrate;
    forming a second metal seed layer on the second resin substrate having the blind via hole using electroless plating;
    forming a second metal pattern plating layer on the substrate having the second metal seed layer using electroplating; and
    removing a portion of the second metal seed layer, having no second metal pattern plating layer.

7. The method as set forth in claim 6, wherein the second resin substrate comprises epoxy resin or fluorine resin.

8. The method as set forth in claim 1, wherein the first resin substrate comprises epoxy resin or fluorine resin.

9. The method as set forth in claim 1, wherein the metal layers are copper.

* * * * *